(12) United States Patent
Takemoto et al.

(10) Patent No.: US 7,825,677 B2
(45) Date of Patent: Nov. 2, 2010

(54) TEST JIG FOR TESTING A PACKAGED HIGH FREQUENCY SEMICONDUCTOR DEVICE

(75) Inventors: Megumi Takemoto, Tokyo (JP); Tomoyuki Kamiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/353,298

(22) Filed: Jan. 14, 2009

(65) Prior Publication Data

US 2010/0052722 A1 Mar. 4, 2010

(30) Foreign Application Priority Data

Sep. 3, 2008 (JP) .............................. 2008-226289

(51) Int. Cl.
*G01R 31/02* (2006.01)
(52) U.S. Cl. .................... 324/755; 324/754; 439/65; 439/71
(58) Field of Classification Search ......... 324/754–765, 324/158.1; 439/65, 71
See application file for complete search history.

(56) References Cited

U.S. PATENT DOCUMENTS

| | | | | |
|---|---|---|---|---|
| 4,697,858 A | * | 10/1987 | Balakrishnan | 439/61 |
| 5,563,509 A | * | 10/1996 | Small | 324/158.1 |
| 5,847,572 A | * | 12/1998 | Iwasaki et al. | 324/755 |
| 6,361,331 B2 | * | 3/2002 | Fork et al. | 439/81 |
| 6,414,501 B2 | * | 7/2002 | Kim et al. | 324/754 |
| 6,703,851 B1 | * | 3/2004 | Howell | 324/754 |
| 6,786,760 B1 | * | 9/2004 | Benavides et al. | 439/490 |
| 6,861,858 B2 | * | 3/2005 | Chen et al. | 324/755 |
| 7,053,496 B2 | * | 5/2006 | Stone | 257/798 |
| 7,098,680 B2 | * | 8/2006 | Fukushima et al. | 324/763 |
| 2008/0048696 A1 | * | 2/2008 | Johnson | 324/755 |

FOREIGN PATENT DOCUMENTS

JP 10-115636 A 5/1998
JP 2004-251720 A 9/2004

* cited by examiner

*Primary Examiner*—Ha Tran T Nguyen
*Assistant Examiner*—Richard Isla Rodas
(74) *Attorney, Agent, or Firm*—Leydig, Voit & Mayer, Ltd.

(57) ABSTRACT

A test jig is for testing electrical characteristics of a high frequency semiconductor device in a package having a ground electrode and a high frequency signal electrode. The test jig includes a test circuit substrate with a microstrip line structure, a grounding block and a high frequency signal contact pin. The test circuit substrate includes an insulating substrate, a ground conductor on a bottom surface of the insulating substrate and high frequency signal wiring on a top surface of the insulating substrate. The grounding block is disposed on the top surface of the insulating substrate and connected to the ground conductor. The high frequency signal contact pin is disposed on the top surface of the insulating substrate and connected to the high frequency signal wiring. The high frequency signal contact pin is spaced from the grounding block.

7 Claims, 7 Drawing Sheets

TEST JIG FOR TESTING A PACKAGED HIGH FREQUENCY SEMICONDUCTOR DEVICE

BACKGROUND OF THE INVENTION

1. Field of the Invention

The present invention relates to a test jig for a high frequency semiconductor package, and more particularly to a test jig suitable for testing the electrical characteristics of a high frequency semiconductor package.

2. Background Art

When the electrical characteristics of a high frequency semiconductor package are to be tested, a wiring of a test circuit substrate is connected between the test equipment (including a computer) and the semiconductor package to allow exchange of high frequency signals therebetween. At that time, electrodes of the high frequency semiconductor package must be electrically connected to the wiring on the test circuit substrate. Conventionally, this is accomplished by means of a known test jig that employs a contactor (see, e.g., Patent Document 1).

[Patent Document 1] Japanese Laid-Open Patent Publication No. 2004-251720

Specifically, this test jig includes a test circuit substrate and a contactor. The test circuit substrate has a microstrip line structure and includes an insulating substrate having a wiring and a ground conductor on its top and bottom surfaces, respectively. The characteristic impedance of the wiring of the test circuit substrate is set to a predetermined value (e.g., 50 Ω). On the other hand, the contactor includes contact pins and a grounding block disposed to face the contact pins. The contact pins are connected to the wiring, etc. of the test circuit substrate. The grounding block is connected to the ground conductor of the test circuit substrate through a via formed in the insulating substrate.

When the electrical characteristics of a high frequency semiconductor package are tested using this conventional test jig, high frequency signals are exchanged between the wiring of the test circuit substrate and an electrode(s) of the high frequency semiconductor package through a contact pin(s) of the contactor. As described above, the characteristic impedance of the wiring of the test circuit substrate is set to a predetermined value. On the other hand, the distance between the contact pin(s) and the grounding block is determined primarily by the size, structure, etc. of the high frequency semiconductor package, meaning that the characteristic impedance of the contact pin(s) may not be able to be matched to that of the wiring of the test circuit substrate. In such a case, the high frequency signals are attenuated or degraded when they pass through the contact pin(s), resulting in the inability to accurately test the electrical characteristics of the high frequency semiconductor package.

SUMMARY OF THE INVENTION

The present invention has been devised to solve the above problems. It is, therefore, an object of the present invention to provide a test jig that enables accurate testing of the electrical characteristics of a high frequency semiconductor package.

According to one aspect of the present invention, a test jig is for testing electrical characteristics of a high frequency semiconductor package having a ground electrode and a high frequency signal electrode. The test jig includes a test circuit substrate with a microstrip line structure, a grounding block and a high frequency signal contact pin. The test circuit substrate includes an insulating substrate, a ground conductor formed on a bottom surface of the insulating substrate and a high frequency signal wiring formed on a top surface of the insulating substrate. The grounding block is disposed on the top surface of the insulating substrate and connected to the ground conductor. The high frequency signal contact pin is disposed on the top surface of the insulating substrate and connected to the high frequency signal wiring, the high frequency signal contact pin being spaced from the grounding block. The grounding block is adapted to be in electrical connection with the ground electrode of the high frequency semiconductor package during the testing. The high frequency signal contact pin is adapted to exchange high frequency signals with the high frequency signal electrode of the high frequency semiconductor package during the testing. The grounding block has a protruding portion facing the high frequency signal contact pin. The protruding portion of the grounding block has a surface that faces and is parallel to the high frequency signal contact pin.

According to another aspect of the present invention, a test jig is for testing electrical characteristics of a high frequency semiconductor package having a ground electrode and a high frequency signal electrode. The test jig includes a test circuit substrate with a microstrip line structure, a grounding block and a high frequency signal contact pin. The test circuit substrate includes an insulating substrate, a ground conductor formed on a bottom surface of the insulating substrate and a high frequency signal wiring formed on a top surface of the insulating substrate. The grounding block is disposed on the top surface of the insulating substrate and connected to the ground conductor. The high frequency signal contact pin is disposed on the top surface of the insulating substrate and connected to the high frequency signal wiring, the high frequency signal contact pin being spaced from the grounding block. The grounding block is adapted to be in electrical connection with the ground electrode of the high frequency semiconductor package during the testing. The high frequency signal contact pin is adapted to exchange high frequency signals with the high frequency signal electrode of the high frequency semiconductor package during the testing. The grounding block has a cutout portion facing the high frequency signal contact pin. The cutout portion of the grounding block has an inner wall surface that faces and is parallel to the high frequency signal contact pin.

According to another aspect of the present invention, a test jig is for testing electrical characteristics of a high frequency semiconductor package having a ground electrode and a high frequency signal electrode. The test jig includes a test circuit substrate with a microstrip line structure, a grounding block, a high frequency signal contact pin and a side ground conductor. The test circuit substrate includes an insulating substrate, a ground conductor formed on a bottom surface of the insulating substrate and a high frequency signal wiring formed on a top surface of the insulating substrate. The grounding block is disposed on the top surface of the insulating substrate and connected to the ground conductor. The high frequency signal contact pin is disposed on the top surface of the insulating substrate and connected to the high frequency signal wiring, the high frequency signal contact pin being spaced from the grounding block. The side ground conductor disposed on the top surface of the insulating substrate and spaced from the high frequency signal contact pin. The grounding block is adapted to be in electrical connection with the ground electrode of the high frequency semiconductor package during the testing. The high frequency signal contact pin is adapted to exchange high frequency signals with the high frequency signal electrode of the high frequency semiconductor package during the testing. The side ground conductor on the top surface of the insulating substrate faces the high frequency signal contact pin in a direction perpendicular to the direction in which the high frequency signal contact pin faces the grounding block. The lower part of the side ground conductor is connected to the ground conductor, and an upper part of the side ground conductor is connected to the grounding block.

Other objects and further features of the present invention will be apparent from the following detailed description when read in conjunction with the accompanying drawings.

DETAILED DESCRIPTION OF THE PREFERRED EMBODIMENTS

Figure 1:
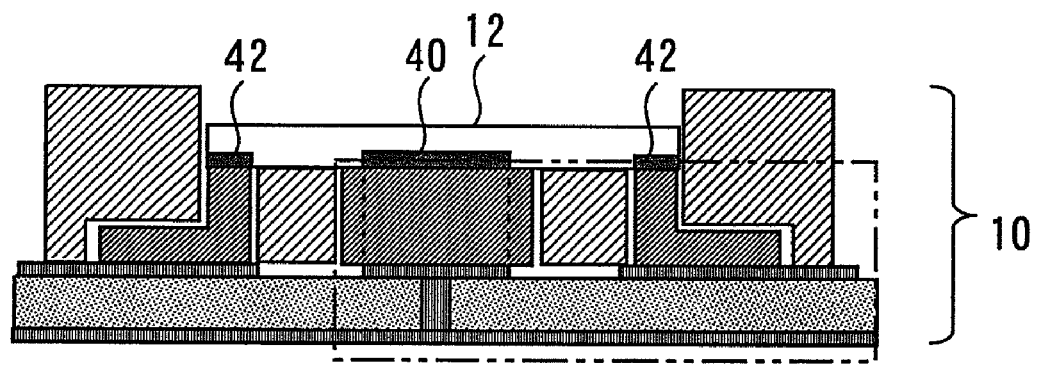
FIG. 1 is a cross-sectional view showing the test jig of a first embodiment with a high frequency semiconductor package coupled thereto.

Now, embodiments of the present invention will be described with reference to the drawings. Like reference numerals denote like components throughout the drawings, and redundant descriptions will be omitted.

First Embodiment

A first embodiment of the present invention relates to a test jig for testing the electrical characteristics of a high frequency semiconductor package. This test jig is of the type that includes a test circuit substrate and a contactor, which is connected to electrodes of the high frequency semiconductor package. High frequency signals are exchanged between an electrode of the high frequency semiconductor package and the wiring of the test circuit substrate through the contactor.

Configuration of Test Jig of First Embodiment

Figure 2:
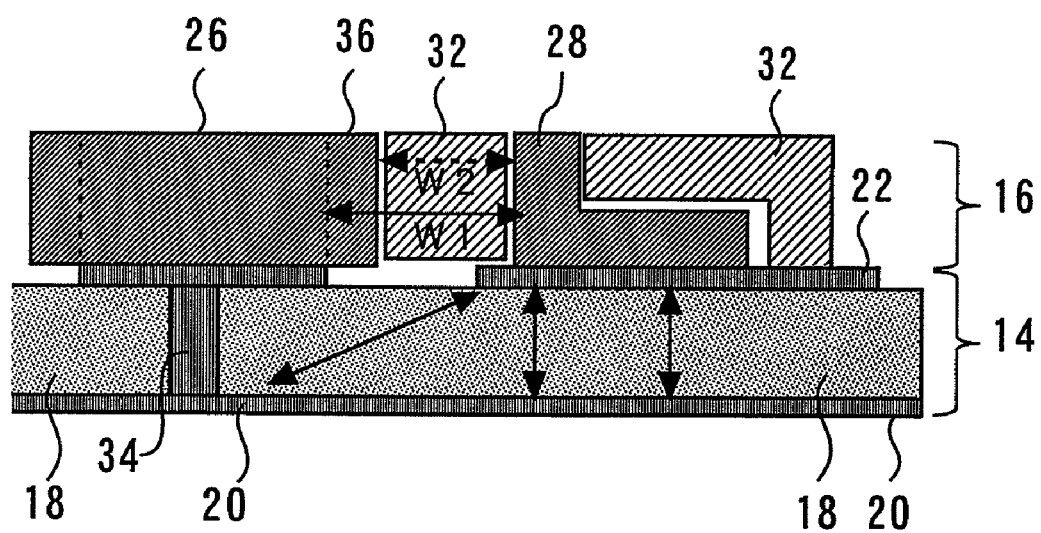
FIG. 2 is an enlarged view of the portion of FIG. 1 enclosed by the two-dot chain line.
Figure 3:
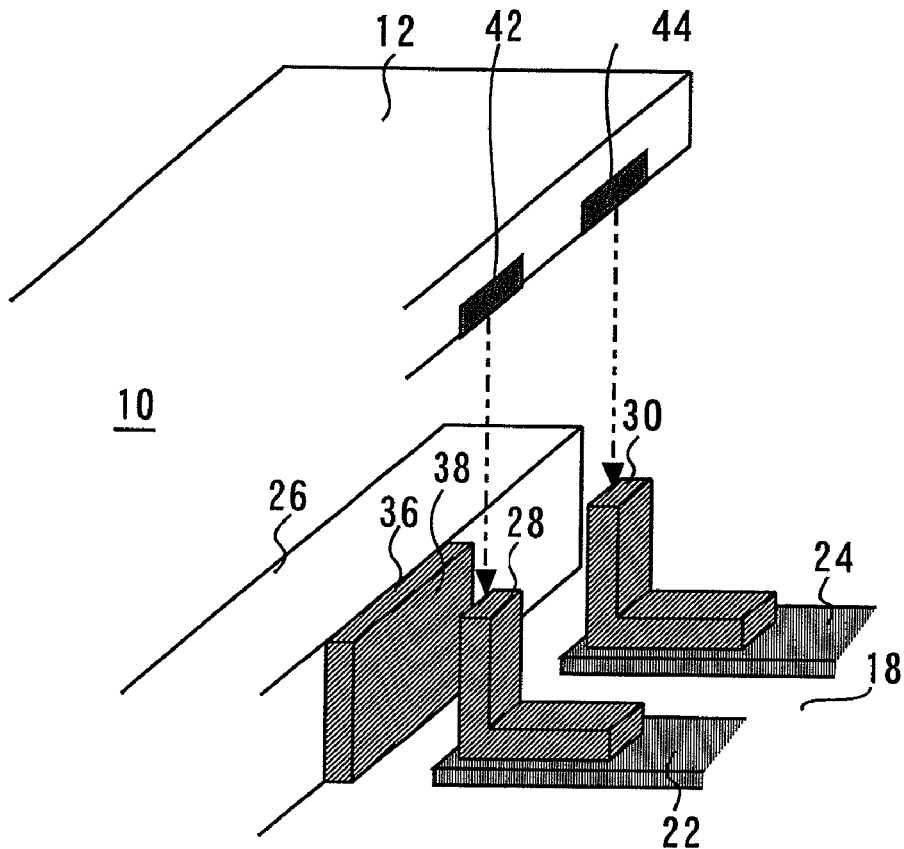
FIG. 3 is a perspective view of FIG. 2.

The configuration of the test jig of the present embodiment will now be described. FIG. 1 is a cross-sectional view showing the test jig, 10, of the present embodiment with a high frequency semiconductor package 12 coupled thereto. FIG. 2 is an enlarged view of the portion of FIG. 1 enclosed by the two-dot chain line, and FIG. 3 is a perspective view of FIG. 2. FIG. 3 also shows the mounting position of the high frequency semiconductor package 12 on the test jig 10.

The test jig 10 includes a test circuit substrate 14 and a contactor 16. The test circuit substrate 14 includes an insulating substrate 18 having a ground conductor 20 on its bottom surface and having a high frequency signal wiring 22 and a DC wiring 24 on its top surface. The contactor 16 includes a grounding block 26, a high frequency signal contact pin 28, and a DC contact pin 30, which are mounted on the top surface of the insulating substrate 18. The high frequency signal contact pin 28 and the grounding block 26 are fixed onto the test circuit substrate 14 by a housing 32 made of insulating material such that they are spaced from each other. It should be noted that the housing 32 is omitted from FIG. 3 for clarity of illustration of the test jig 10.

The grounding block 26 is connected to the ground conductor 20 of the test circuit substrate 14 through a via 34 formed in the insulating substrate 18. Further, the high frequency signal contact pin 28 is connected to the high frequency signal wiring 22 of the test circuit substrate 14, and the DC contact pin 30 is connected to the DC wiring 24 of the test circuit substrate 14.

The insulating substrate 18, the ground conductor 20, and the high frequency signal wiring 22 of the test circuit substrate 14 form a microstrip line structure. The high frequency signal wiring 22 is spaced a fixed distance from the ground conductor 20 by the insulating substrate 18 so that the high frequency signal wiring 22 has a characteristic impedance of 50 Ω. On the other hand, the grounding block 26 and the high frequency signal contact pin 28 of the contactor 16 and the housing 32 sandwiched therebetween also form a microstrip line structure. In FIG. 2, the double arrowed solid line indicates distances between the wiring and the grounding surface of these microstrip line structures without taking the protruding portion 36 into consideration. Specifically, the double arrowed solid line indicates the distance, W1, between the high frequency signal contact pin 28 (acting as a wiring) and the main part of the grounding block 26 (acting as a grounding surface without taking the protruding portion 36 into consideration).

According to the present embodiment, the grounding block 26 has a protruding portion 36 that faces the high frequency signal contact pin 28, as shown in FIG. 3. The protruding portion 36 has a surface 38 that faces and is parallel to the high frequency signal contact pin 28. In FIG. 2, the double arrowed broken line indicates the distance, W2, between the high frequency signal contact pin 28 (acting as a wiring) and the protruding portion 36 (acting as a grounding surface).

Test Method Using Test Jig of First Embodiment

There will now be described a method for testing the electrical characteristics of the high frequency semiconductor package 12 by using the test jig 10 of the present embodiment.

First, the grounding block 26, the high frequency signal contact pin 28, and the DC contact pin 30 are connected to a ground electrode 40, a high frequency signal electrode 42, and a DC electrode 44, respectively, of the high frequency semiconductor package 12. (In FIG. 3, the arrowed two-dot chain lines indicate the directions in which the high frequency signal electrode 42 and the DC electrode 44 of the high frequency semiconductor package 12 are brought into engagement with the respective contact pins of the test jig 10.)

Next, the test equipment (including a computer) exchanges high frequency signals with the high frequency semiconductor package 12 through the high frequency signal wiring 22 to test the electrical characteristics of the package. At that time, the high frequency signal output from the test equipment pass through the high frequency signal wiring 22 and the high frequency signal contact pin 28 to the high frequency signal electrode 42 of the high frequency semiconductor package 12. (The grounding block 26 is in electrical connection with the ground electrode 40 of the high frequency semiconductor package 12.) Further, a DC current is supplied to the DC electrode 44 of the high frequency semiconductor package 12 through the DC contact pin 30.

Advantages of First Embodiment

Figure 4:
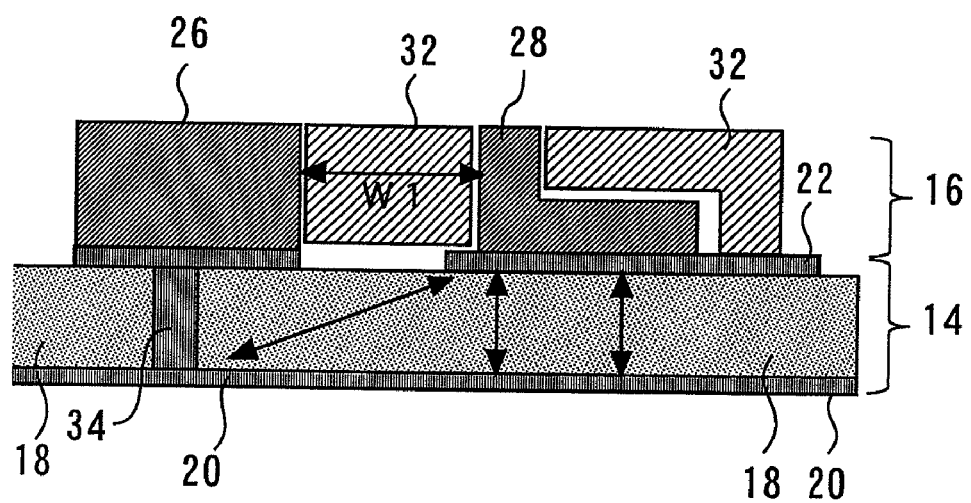
FIG. 4 is a cross-sectional view of a comparative test jig of the first embodiment.

In order to better understand the advantages of the test jig 10 of the present embodiment, it will be helpful to first describe a comparative prior art test jig 46. FIG. 4 is a cross-sectional view of the comparative test jig 46. In this comparative test jig 46, the grounding block 26 does not have a protruding portion 36 as in the test jig 10 of the present embodiment. Except for this, the construction of the comparative test jig 46 is identical to that of the test jig 10. In FIG. 4, the double arrowed solid line indicates the distance, W1, between the high frequency signal contact pin 28 and the grounding block 26, as in FIG. 2, which shows the test jig 10 of the present embodiment.

In both the test jig 10 and the comparative test jig 46, the distance W1 is determined primarily by the structure, etc. of the high frequency semiconductor package 12 to be tested. In the case of the comparative test jig 46, a change in the distance W1 results in a corresponding change in the characteristic impedance of the high frequency signal contact pin 28. This may prevent the characteristic impedance of the high frequency signal contact pin 28 from being matched to that of the high frequency signal wiring 22 (i.e., 50 Ω) in the comparative test jig 46. In such a case, the high frequency signals exchanged between the high frequency semiconductor package 12 and the test equipment may be attenuated or degraded when they pass through the high frequency signal contact pin 28.

In the case of the test jig 10 of the present embodiment, on the other hand, the grounding block 26 has the protruding portion 36, which faces the high frequency signal contact pin 28. Naturally, the distance, W2, between the protruding portion 36 of the grounding block 26 and the high frequency signal contact pin 28 is smaller than the distance W1 between the other portion (or main part) of the grounding block 26 and the high frequency signal contact pin 28, meaning that in the test jig 10 of the present embodiment the high frequency signal contact pin 28 has a lower characteristic impedance than in the comparative test jig 46. Therefore, the characteristic impedance of the high frequency signal contact pin 28 can be adjusted to be substantially equal to that of the high frequency signal wiring 22 (i.e., 50 Ω), thus matching these characteristic impedances. As a result, in testing the high frequency semiconductor package 12 with the test jig 10, the high frequency signals exchanged between the high frequency semiconductor package 12 and the test equipment are prevented from being attenuated or degraded when they pass through the high frequency signal contact pin 28 of the test jig 10, thereby allowing accurate testing of the electrical characteristics of the high frequency semiconductor package 12.

Although in the present embodiment the characteristic impedance of the high frequency signal contact pin 28 is matched to that of the high frequency signal wiring 22 only by providing the protruding portion 36, it is to be understood that in other embodiments this matching may be further accomplished by varying the dielectric constant of the housing 32 between the grounding block 26 and the high frequency signal contact pin 28, which allows accurate testing of the electrical characteristics of the high frequency semiconductor package 12.

Second Embodiment

A second embodiment of the present invention also relates to a test jig for testing the electrical characteristics of a high frequency semiconductor package. This test jig is of the same type as the test jig 10 of the first embodiment. That is, when a high frequency semiconductor package is tested with this test jig, high frequency signals are exchanged between an electrode of the high frequency semiconductor package and the wiring of the test circuit substrate of the test jig through the contactor. It should be noted that only so much of this test jig will be described as necessary for an understanding of its features as compared to those of the test jig of the first embodiment.

Configuration of Test Jig of Second Embodiment

Figure 5:
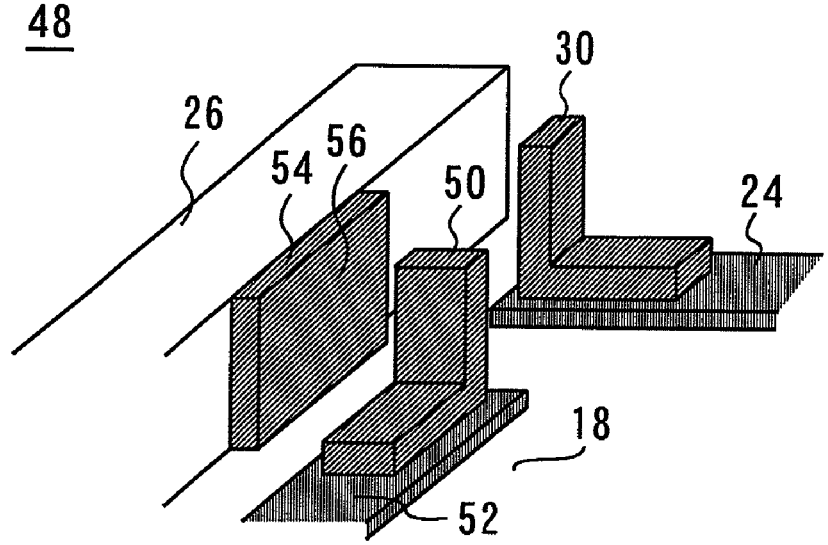
FIG. 5 is a perspective view of a test jig of a second embodiment.

FIG. 5 is a perspective view of the test jig, 48, of the second embodiment. In FIG. 5, components which are common to the test jig 10 of the first embodiment bear the same reference numerals. The test jig 48 includes a high frequency signal contact pin 50 and a high frequency signal wiring 52 connected to the contact pin 50. (The high frequency signal wiring 52 has a configuration matching that of the high frequency signal contact pin 50.) The type of high frequency semiconductor package to be tested with the test jig 48 of the present embodiment differs in configuration from that to be tested with the test jig 10 of the first embodiment. Therefore, the shape and position of the high frequency signal contact pin 50 are designed to match the shape and position of the high frequency signal electrode of the high frequency semiconductor package to be tested with the test jig 48. Specifically, the high frequency signal contact pin 50 faces in a different direction than the high frequency signal contact pin 28 of the first embodiment, as shown in FIG. 5.

The grounding block 26 has a protruding portion 54 that faces the part of the high frequency signal contact pin 50, which is perpendicular to the insulating substrate 18, as in the first embodiment. More specifically, the protruding portion 54 has a surface 56 that faces and is parallel to the part of the high frequency signal contact pin 50, which is perpendicular to the insulating substrate 18.

Advantages of Second Embodiment

Thus the test jig 48 of the present embodiment has the same advantages as the test jig 10 of the first embodiment.

Third Embodiment

A third embodiment of the present invention also relates to a test jig for testing the electrical characteristics of a high frequency semiconductor package. This test jig is of the same type as the test jig 10 of the first embodiment. That is, when a high frequency semiconductor package is tested with this test jig, high frequency signals are exchanged between an electrode of the high frequency semiconductor package and the wiring of the test circuit substrate of the test jig through the contactor. It should be noted that only so much of this test jig will be described as necessary for an understanding of its features as compared to those of the test jig of the first embodiment.

Configuration of Test Jig of Third Embodiment

Figure 6:
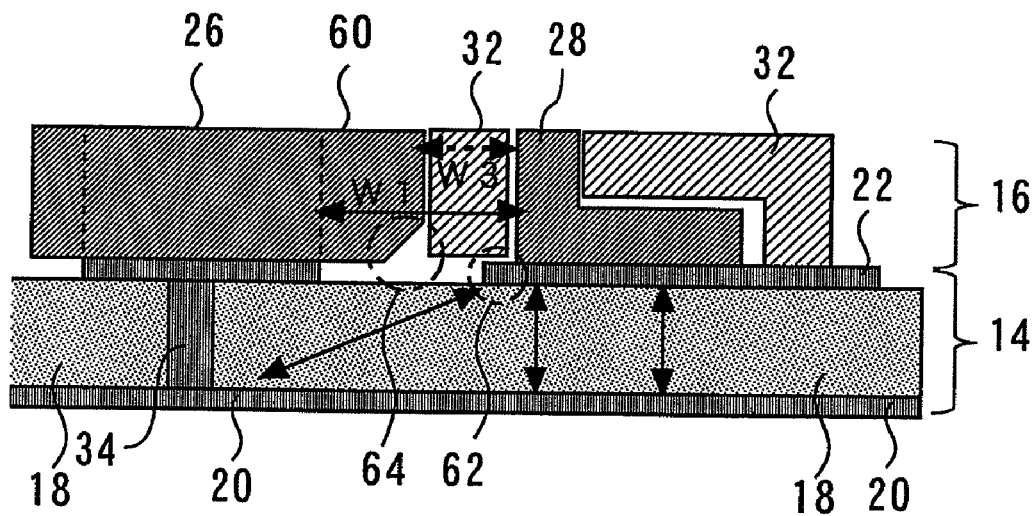
FIG. 6 is a cross-sectional view of a test jig of a third embodiment.

FIG. 6 is a cross-sectional view of the test jig, 58, of the third embodiment. In FIG. 6, components which are common to the test jig 10 of the first embodiment bear the same reference numerals. As shown in FIG. 6, the protruding portion, 60, of the grounding block 26 has a cutout portion 64 located near an edge 62 of the high frequency signal wiring 22.

Advantages of Third Embodiment

When this test jig 58 is manufactured, the high frequency signal contact pin 28 must be disposed more inside than the edge 62 of the high frequency signal wiring 22. This means that the edge 62 is disposed closer to the grounding block 26 than the high frequency signal contact pin 28. Therefore, if the protruding portion 60 did not have the cutout portion 64, it might come into contact with the edge 62 of the high frequency signal wiring 22 by putting the protruding portion 60 close to the high frequency signal contact pin 28 (in the worst case). In such a case, the high frequency signal wiring 22 is shorted to the grounding block 26, thereby preventing testing of the high frequency semiconductor package.

The cutout portion 64 of the protruding portion 60 eliminates this possibility. Therefore, the protruding portion 60 can be disposed as close to the high frequency signal contact pin 28 as possible, without fear of contact of the protruding portion 60 with the edge 62 of the high frequency signal wiring 22. As a result, the characteristic impedance of the high frequency signal contact pin 28 can be adjusted over a wide range to match the characteristic impedance of the high frequency signal wiring 22.

Fourth Embodiment

A fourth embodiment of the present invention also relates to a test jig for testing the electrical characteristics of a high frequency semiconductor package. This test jig is of the same type as the test jig 10 of the first embodiment. That is, when a high frequency semiconductor package is tested with this test jig, high frequency signals are exchanged between an electrode of the high frequency semiconductor package and the wiring of the test circuit substrate of the test jig through the contactor. It should be noted that only so much of this test jig will be described as necessary for an understanding of its features as compared to those of the test jig of the first embodiment.

Configuration of Test Jig of Fourth Embodiment

Figure 7:
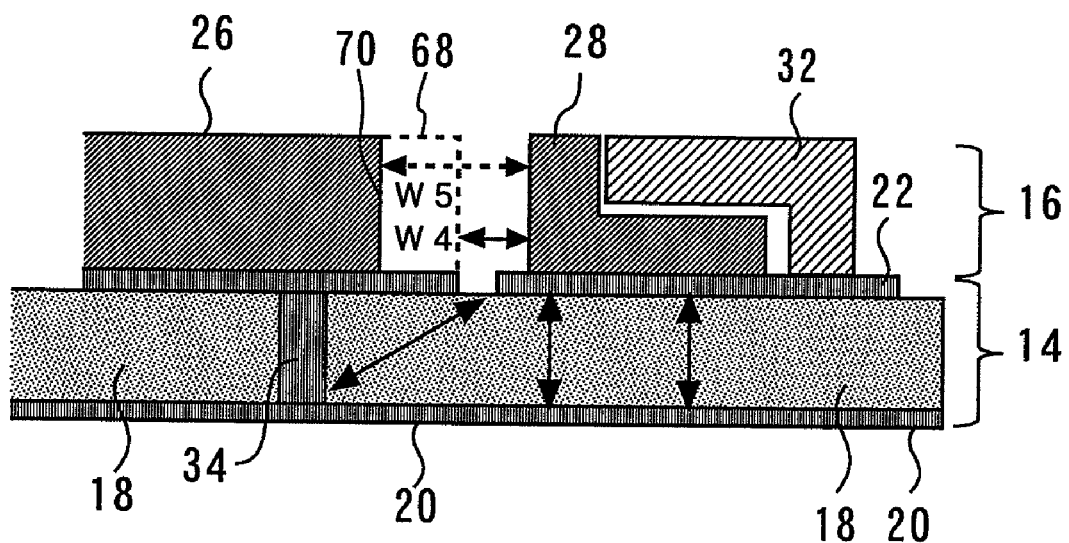
FIG. 7 is a cross-sectional view of a test jig of a fourth embodiment.
Figure 8:
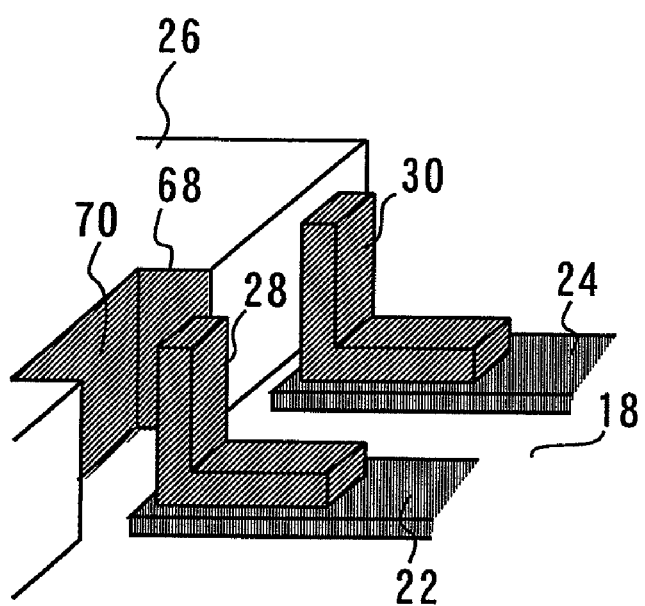
FIG. 8 is a perspective view of FIG. 7.

FIG. 7 is a cross-sectional view of the test jig, 66, of the fourth embodiment. FIG. 8 is a perspective view of FIG. 7. In FIGS. 7 and 8, components which are common to the test jig 10 of the first embodiment bear the same reference numerals. In this test jig 66, the grounding block 26 has a cutout portion 68 that faces the high frequency signal contact pin 28, as shown in FIG. 8. The cutout portion 68 has an inner wall 70 that faces and is parallel to the high frequency signal contact pin 28. In FIG. 7, the broken line indicates the cutout portion 68 of the grounding block 26.

In FIG. 7, reference numeral W4 denotes the distance between the high frequency contact pin 28 and the grounding block 26 when the grounding block 26 does not have the cutout portion 68 (a prior art arrangement). Reference numeral W5, on the other hand, denotes the distance between the high frequency contact pin 28 and the inner wall 70 of the cutout portion 68 of the ground block 26 (i.e., the distance between the high frequency contact pin 28 and the grounding block 26 in the test jig 66 of the present embodiment).

Advantages of Fourth Embodiment

The advantages of the test jig 66 of the present embodiment will now be described.

Referring still to FIGS. 7 and 8, when the grounding block 26 does not have the cutout portion 68 (a prior art arrangement), the distance W4 between the high frequency contact pin 28 and the grounding block 26 is determined primarily by the structure, etc. of the high frequency semiconductor package to be tested. It should be noted that a change in the distance W4 results in a corresponding change in the characteristic impedance of the high frequency signal contact pin 28. This may prevent the characteristic impedance of the high frequency signal contact pin 28 from being matched to that of the high frequency signal wiring 22 (i.e., 50 Ω). That is, when the grounding block 26 does not have the cutout portion 68, the high frequency signals exchanged between the high frequency semiconductor package and the test equipment may be attenuated or degraded when they pass through the high frequency signal contact pin 28.

In the case of the test jig 66 of the present embodiment, on the other hand, the grounding block 26 has the cutout portion 68, which faces the high frequency signal contact pin 28. Naturally, the distance W5 between the high frequency contact pin 28 and the facing inner wall 70 of the cutout portion 68 of the grounding block 26 is greater than the distance W4 between the high frequency signal contact pin 28 and the grounding block 26 when the grounding block 26 does not have the cutout portion 68 (a prior art arrangement), meaning that the high frequency signal contact pin 28 has a higher characteristic impedance as compared to when the grounding block 26 does not have the cutout portion 68. Therefore, the characteristic impedance of the high frequency signal contact pin 28 can be adjusted to be substantially equal to that of the high frequency signal wiring 22 (i.e., 50 Ω), thus matching these characteristic impedances. This prevents the high frequency signals from being attenuated or degraded when they pass through the high frequency signal contact pin 28, thereby allowing accurate testing of the electrical characteristics of the high frequency semiconductor package.

Fifth Embodiment

A fifth embodiment of the present invention also relates to a test jig for testing the electrical characteristics of a high frequency semiconductor package. This test jig has a configuration similar to that of the test jig of the fourth embodiment; the grounding block of this test jig also has a cutout portion. It should be noted that only so much of this test jig will be described as necessary for an understanding of its features as compared to those of the test jig of the fourth embodiment.

Configuration of Test Jig of Fifth Embodiment

Figure 9:
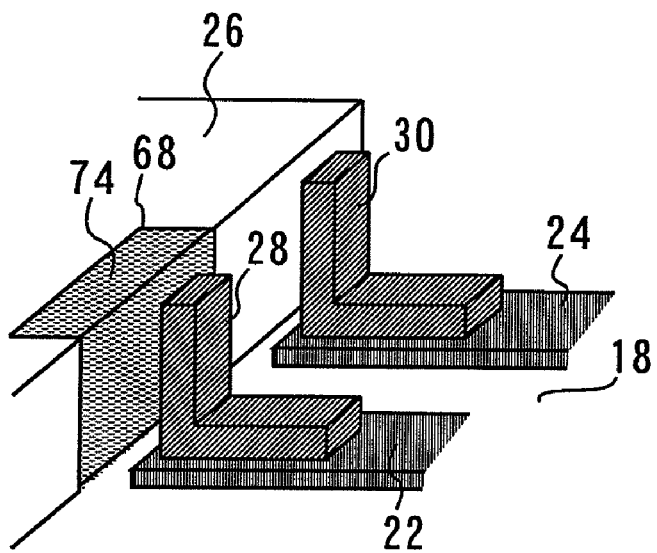
FIG. 9 is a perspective view of a test jig of a fifth embodiment.

FIG. 9 is a perspective view of the test jig, 72, of the fifth embodiment. In FIG. 9, components which are common to the test jig 66 of the fourth embodiment bear the same reference numerals. In this test jig 72, the cutout portion 68 of the grounding block 26 is filled with a ceramic insulating material 74 having a low dielectric constant, as shown in FIG. 9.

Advantages of Fifth Embodiment

When a high frequency semiconductor package is tested using this type of test jig, the high frequency signal contact pin 28 of the test jig may be bent toward the grounding block 26 side by the force exerted by the high frequency signal electrode of the high frequency semiconductor package when the electrode is brought into engagement with the high frequency contact pin 28. In such a case, if it were not for the insulating material 74 (i.e., in the case of the test jig of the fourth embodiment), the high frequency signal contact pin 28 might be bent into the inside of the cutout portion 68, thus reducing the distance between the high frequency signal contact pin 28 and the grounding block 26 resulting in a corresponding reduction in the characteristic impedance of the high frequency signal contact pin 28. This may prevent the characteristic impedance of the high frequency signal contact pin 28 from being adjusted in the manner described above in connection with the fourth embodiment; that is, it may not be possible to adjust the characteristic impedance of the high frequency signal contact pin 28 to be substantially equal to that of the high frequency signal wiring 22 (i.e., 50 Ω).

As described above, in the test jig 72 of the present embodiment, the cutout portion 68 of the grounding block 26 is filled with the ceramic insulating material 74 having a low dielectric constant, thereby preventing the high frequency signal contact pin 28 from being bent into the inside of the cutout portion 68. This prevents the high frequency signal contact pin 28 from coming as close to the grounding block 26 as when the cutout portion 68 is not filled with the insulating material 74, and thus prevents the resulting reduction in the characteristic impedance of the high frequency signal contact pin 28. Therefore, the characteristic impedance of the high frequency signal contact pin 28 can be adjusted to be substantially equal to that of the high frequency signal wiring 22 (i.e., 50 Ω), thus matching these characteristic impedances. This prevents the high frequency signals from being attenuated or degraded when they pass through the high frequency signal contact pin 28, thereby allowing accurate testing of the electrical characteristics of the high frequency semiconductor package.

It should be noted that the cutout portion 68 may be filled with a Teflon® insulating material, instead of a ceramic insulating material. This also prevents the high frequency signal contact pin 28 from coming close to the grounding block 26 and thus prevents the resulting reduction in the characteristic impedance of the high frequency signal contact pin 28.

According to the present embodiment, the characteristic impedance of the high frequency signal contact pin 28 may be adjusted to be substantially equal to that of the high frequency signal wiring 22 (i.e., 50 Ω) by varying the dielectric constant of the insulating material 74 in the cutout portion 68, allowing accurate testing of the electrical characteristics of the high frequency semiconductor package.

Sixth Embodiment

A sixth embodiment of the present invention also relates to a test jig for testing the electrical characteristics of a high frequency semiconductor package. This test jig has a configuration similar to that of the test jig of the fourth embodiment; the grounding block of this test jig also has a cutout portion. It should be noted that only so much of this test jig will be described as necessary for an understanding of its features as compared to those of the test jig of the fourth embodiment.

Configuration of Test Jig of Sixth Embodiment

Figure 10:
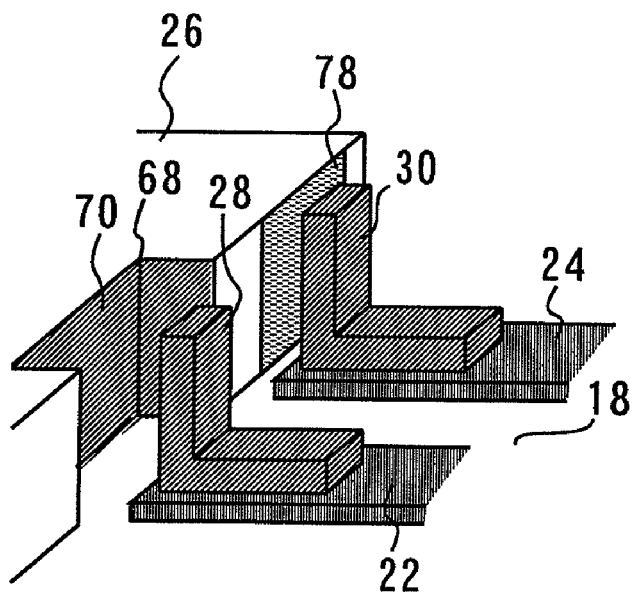
FIG. 10 is a perspective view of a test jig of a sixth embodiment.

FIG. 10 is a perspective view of the test jig, 76, of the sixth embodiment. In FIG. 10, components which are common to the test jig 66 of the fourth embodiment bear the same reference numerals. In this test jig 76, an insulating film 78 of Teflon® covers the surface portion of the grounding block 26 that faces the DC contact pin 30, as shown in FIG. 10.

Advantages of Sixth Embodiment

When a high frequency semiconductor package is tested using this type of test jig, the DC contact pin 30 may be bent toward the grounding block 26 side by the force exerted by the DC electrode of the high frequency semiconductor package when the electrode is brought into engagement with the DC contact pin 30. In such a case, if it were not for the insulating film 78 on the grounding block 26, the DC contact pin 30 might be bent into contact with the grounding block 26 and shorted.

As described above, in the test jig 76 of the present embodiment, the insulating film 78 covers the surface portion of the grounding block 26 that faces the DC contact pin 30. This prevents the DC contact pin 30 from directly contacting with the surface of the grounding block 26 and thus prevents the resulting electrical shorting between them.

It should be noted that the insulating film 78 may be an anodized aluminum insulating film or a DLC insulating film, instead of a Teflon®insulating film. These films can also serve to prevent electrical shorting between the DC contact pin 30 and the grounding block 26.

Seventh Embodiment

A seventh embodiment of the present invention also relates to a test jig for testing the electrical characteristics of a high frequency semiconductor package. This test jig is of the same type as the test jig 10 of the first embodiment. That is, when a high frequency semiconductor package is tested using this test jig, high frequency signals are exchanged between an electrode of the high frequency semiconductor package and the wiring of the test circuit substrate of the test jig through the contactor. It should be noted that only so much of this test jig will be described as necessary for an understanding of its features as compared to those of the test jig of the first embodiment.

Configuration of Test Jig of Seventh Embodiment

Figure 11:
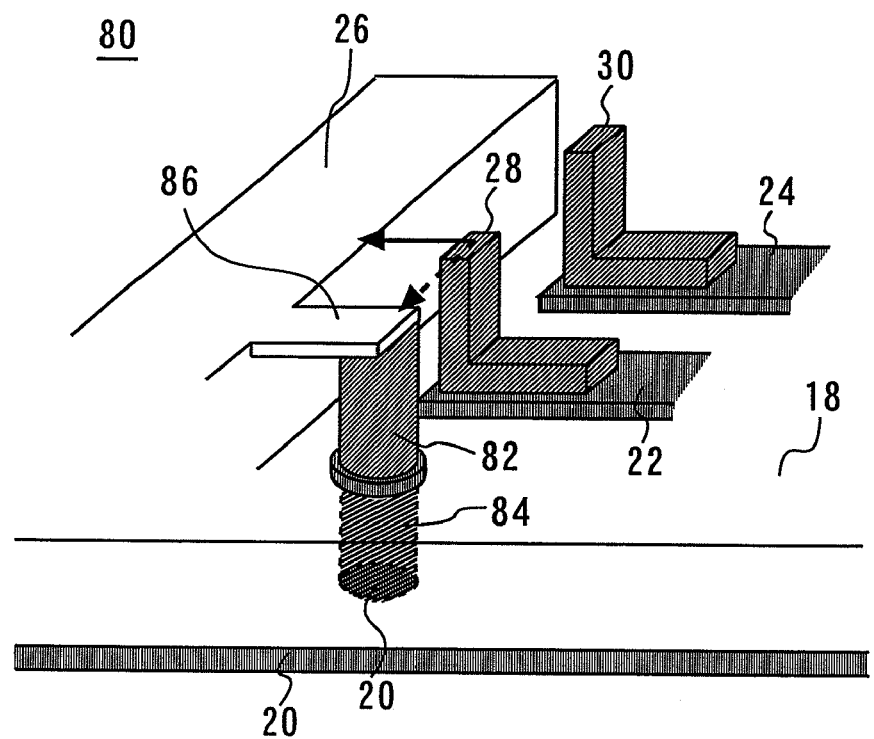
FIG. 11 is a perspective view of a test jig of a seventh embodiment.
Figure 12:
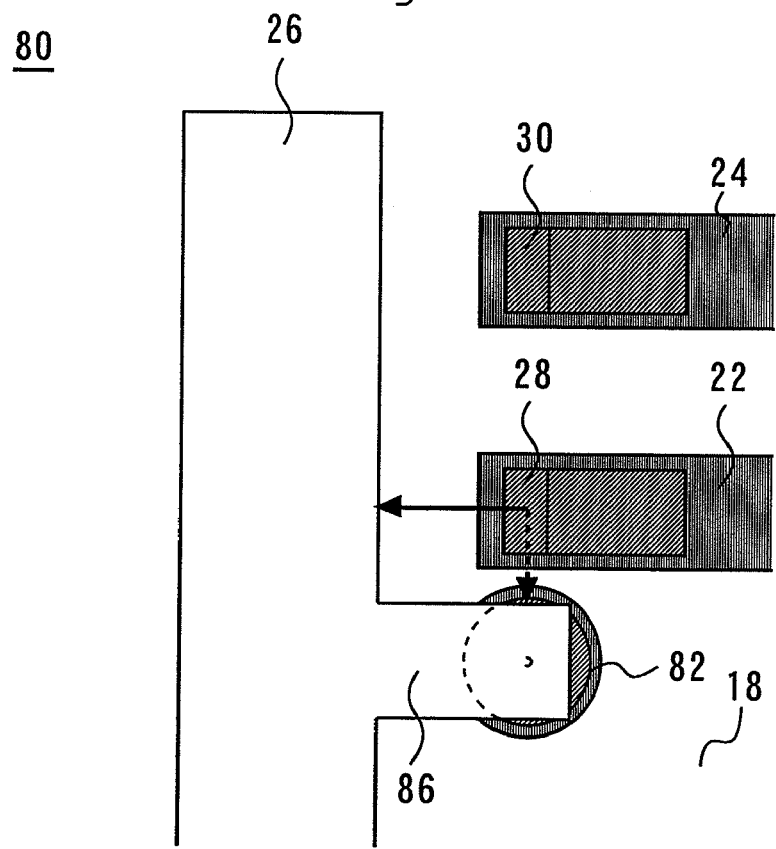
FIG. 12 is a plan view of a test jig shown in FIG. 11.

FIG. 11 is a perspective view of the test jig, 80, of the seventh embodiment. FIG. 12 is a plan view of the test jig 80 shown in FIG. 11. In FIGS. 11 and 12, components which are common to the test jig 10 of the first embodiment bear the same reference numerals.

This test jig 80 includes a bar conductor 82 that is disposed on the top surface of the insulating substrate 18 and spaced from the high frequency signal contact pin 28. In FIG. 12, the arrowed solid line indicates the direction in which the high frequency signal contact pin 28 faces the grounding block 26. The arrowed broken line, on the other hand, indicates the direction in which the high frequency signal contact pin 28 faces the bar conductor 82. (This direction is perpendicular to the direction in which the high frequency signal contact pin 28 faces the grounding block 26.) The lower part of the bar conductor 82 is connected to the ground conductor 20 through a via 84 in the insulating substrate 18. Further, a waveguide 86 is provided which connects between the upper part of the grounding block 26 and the upper part of the bar conductor 82.

Advantages of Seventh Embodiment

When a high frequency semiconductor package is tested using this test jig 80, the high frequency signal output from the test equipment is delivered through the high frequency signal wiring 22 and the high frequency signal contact pin 28 to the high frequency signal electrode of the high frequency semiconductor package. It should be noted that the bar conductor 82 is electrically connected to the ground conductor 20 through the via 84 in the insulating substrate 18, and also electrically connected to the grounding block 26 through the waveguide 86. Further, the grounding block 26 is in electrical connection with the ground electrode of the high frequency semiconductor package during the testing of the package. Therefore, the bar conductor 82 acts as a grounding surface of the microstrip line structure that includes the high frequency signal contact pin 28.

That is, both the grounding block 26 and the bar conductor 82 act as grounding surfaces of the microstrip line structure that includes the high frequency signal contact pin 28, which acts as a wiring. Therefore, the characteristic impedance of the high frequency signal contact pin 28 can be adjusted to be substantially equal to that of the high frequency signal wiring 22 (i.e., 50 $\Omega$), thus matching these characteristic impedances. This prevents the high frequency signals from being attenuated or degraded when they pass through the high frequency signal contact pin 28, thereby allowing accurate testing of the electrical characteristics of the high frequency semiconductor package.

Eighth Embodiment

An eighth embodiment of the present invention also relates to a test jig for testing the electrical characteristics of a high frequency semiconductor package. This test jig is of the same type as the test jig 10 of the first embodiment. That is, when a high frequency semiconductor package is tested using this test jig, high frequency signals are exchanged between electrodes of the high frequency semiconductor package and the wiring of the test circuit substrate of the test jig through the contactor. It should be noted that only so much of this test jig will be described as necessary for an understanding of its features as compared to those of the test jig of the first embodiment.

Configuration of Test Jig of Eighth Embodiment

Figure 13:
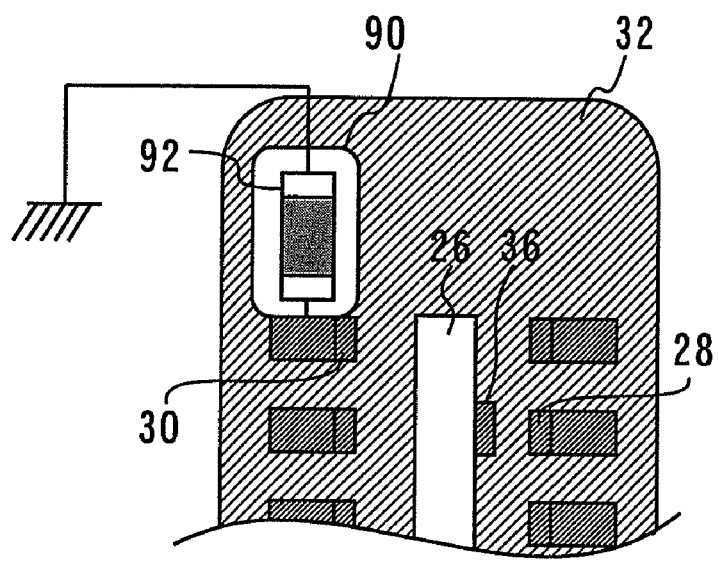
FIG. 13 is a plan view of a test jig of a eighth embodiment.

FIG. 13 is a plan view of the test jig, 88, of the eighth embodiment. In FIG. 13, components which are common to the test jig 10 of the first embodiment bear the same reference numerals. Referring to FIG. 13, this test jig 88 includes an opening 90 formed in the housing 32 and disposed in close proximity to a DC contact pin 30. The test jig 88 also includes a capacitor 92 disposed within the opening 90; that is, the capacitor 92 is located near the DC contact pin 30. One plate of the capacitor 92 is connected to the DC contact pin 30, and the other plate is grounded.

Advantages of Eighth Embodiment

In practical applications, each high frequency semiconductor package is directly soldered onto a circuit board. A capacitor is disposed near the DC electrode of the high frequency semiconductor package on the circuit board. One plate of the capacitor is connected to the DC electrode of the high frequency semiconductor package, and the other plate is grounded. This forms a matching circuit for preventing unwanted oscillation in the high frequency semiconductor package. (The capacitor acts as a matching element.)

On the other hand, in the test jig 88 of the present embodiment, the capacitor 92 is disposed near the DC contact pin 30, as described above. One plate of the capacitor 92 is connected to the DC contact pin 30, and the other plate is grounded. This forms a matching circuit for preventing unwanted oscillation in the high frequency semiconductor package under test. (The capacitor 92 acts a matching element.) That is, the test jig 88 permits the electrical characteristics of a high frequency semiconductor package to be tested under conditions closely simulating actual use of the package.

Variation of Eighth Embodiment

Figure 14:
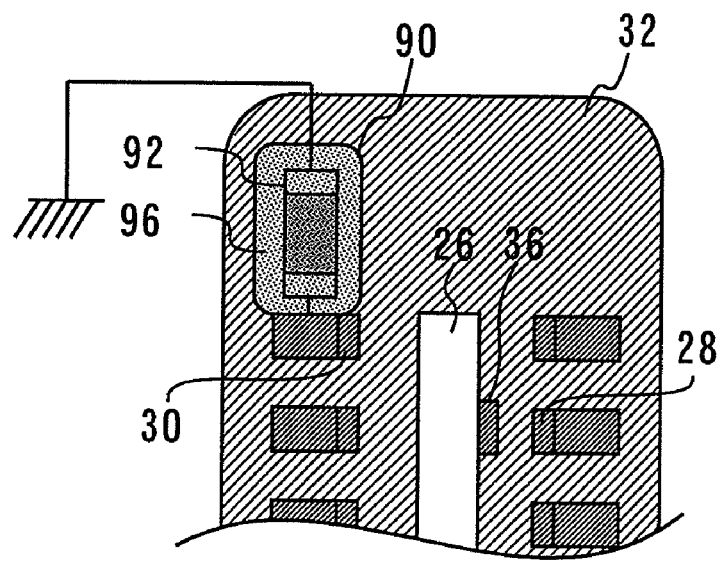
FIG. 14 is a plan view of a test jig 94 according to a variation of the eighth embodiment.

In the test jig 88 of the present embodiment, the opening 90 formed in the housing 32 and containing the capacitor 92 is not filled or covered with any material. However, the opening 90 may be filled or covered with a suitable material. FIG. 14 is a plan view of a test jig 94 according to a variation of the present embodiment. In this test jig 94, the opening 90 is provided with a cover 96 of an epoxy resin, etc. to cover or encapsulate the capacitor 92, as shown in FIG. 14. This construction is preferred, since the capacitor 92, like the housing 32, can be used as a member for fixing the DC contact pin 30. This prevents the DC contact pin 30 from being bent by the force exerted by the DC electrode of the high frequency semiconductor package when the electrode is brought into engagement with the DC contact pin 30, thereby ensuring good electrical contact between the DC electrode and the DC contact pin 30.

Although in the present embodiment the DC contact pin 30 is connected to a matching circuit, it is to be understood that in other embodiments the high frequency signal contact pin 28 may be connected to a matching circuit. Specifically, an opening may be provided in close proximity to the high frequency signal contact pin 28, and a matching element (such as a capacitor) may be disposed within the opening.

Further, although in the present embodiment the matching circuit of the test jig is made up of a capacitor connected at one plate to the DC contact pin and at the other plate to the ground, it is to be understood that it may have any configuration that appropriately simulates the matching circuit on the circuit board on which the high frequency semiconductor package is actually mounted.

The major benefits of the present invention described above are summarized follows:

According to a first aspect of the present invention, the electrical characteristics of a high frequency semiconductor package are able to be tested accurately.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-226289, filed on Sep. 3, 2008 including specification, claims, drawings and summary, on which the Convention priority of the present application is based, are incorporated herein by reference in its entirety.

What is claimed is:

1. A test jig for testing electrical characteristics of a high frequency semiconductor device including a package and having, accessible at the package, a ground electrode and a high frequency signal electrode, the test jig comprising:

a test circuit substrate including an insulating substrate having top and bottom surfaces, a ground conductor located on said bottom surface of said insulating substrate, and a high frequency signal wiring located on said top surface of said insulating substrate;

a grounding block disposed on said top surface of said insulating substrate and electrically connected to said ground conductor through said insulating substrate, said grounding block including a top surface for supporting the package of the semiconductor device and making an electrical connection to the ground electrode of the semiconductor device during testing of the semiconductor device using said test jig, said top surface of said grounding block being substantially parallel to said top surface of said insulating substrate, and a side surface transverse to said top surfaces of said insulating substrate and said grounding block, said side surface extending longitudinally along said top surface of said insulating substrate;

a high frequency signal contact pin fixedly disposed on and protruding outward from said top surface of said insulating substrate, parallel to and spaced from said side surface of said grounding block, and connected to said high frequency signal wiring, said high frequency signal contact pin having a top surface making an electrical connection to the high frequency signal electrode of the semiconductor device during testing of the semiconductor device using said test jig, wherein said side surface of said grounding block includes a protruding portion protruding outward, toward said high frequency signal contact pin, relative to remaining parts of said side surface of said grounding block, from only part of said side surface, extending along part of the longitudinal direction of said grounding block, from said top surface of said insulating substrate to said top surface of said grounding block, and having a protruding side surface that faces and is parallel to said high frequency signal contact pin; and an insulating material disposed between said protruding portion of said side surface of said grounding block and said side surface of said high frequency signal contact pin.

2. The test jig according to claim 1, wherein said protruding portion of said grounding block has a cutout portion located near said high frequency signal wiring.

3. The test jig according to claim 1, further comprising a matching circuit disposed near said high frequency signal contact pin and including a matching element connected to said high frequency signal contact pin.

4. The test jig according to claim 3, wherein said matching element is covered with a cover of an insulating material.

5. The test jig according to claim 1, wherein the high frequency semiconductor device includes a DC electrode accessible at the package of the high frequency semiconductor device, the test jig further comprising:

DC wiring located on said top surface of said insulating substrate; and a DC contact pin fixedly disposed on and protruding outwardly from said top surface of said insulating substrate, parallel to and spaced from said side surface of said grounding block, and connected to said DC wiring, said DC contact pin having a top surface making an electrical connection to the DC electrode of the semiconductor device during testing of the semiconductor device using said test jig.

6. The test jig according to claim 5, further comprising a matching circuit disposed near said DC contact pin and including a matching element connected to said DC contact pin.

7. The test jig according to claim 6, wherein said matching element is covered with a cover of an insulating material.

* * * * *